(12) United States Patent
Friedl

(10) Patent No.: US 7,839,056 B2
(45) Date of Patent: Nov. 23, 2010

(54) PIEZOELECTRIC PRESSURE SENSOR

(75) Inventor: Alexander Friedl, Graz (AT)

(73) Assignee: Piezocryst Advanced Sensorics GmbH, Graz (AT)

( * ) Notice: Subject to any disclaimer, the term of this patent is extended or adjusted under 35 U.S.C. 154(b) by 131 days.

(21) Appl. No.: 11/984,664

(22) Filed: Nov. 20, 2007

(65) Prior Publication Data

US 2008/0116766 A1    May 22, 2008

(30) Foreign Application Priority Data

Nov. 22, 2006    (AT) .............................. A 1937/2006

(51) Int. Cl.
*H01L 41/04* (2006.01)
*H01L 41/053* (2006.01)
(52) U.S. Cl. ................... 310/338; 310/346; 310/348
(58) Field of Classification Search ................ 310/338, 310/341, 346–348
See application file for complete search history.

(56) References Cited

U.S. PATENT DOCUMENTS

| 3,171,989 A | 3/1965 | Hatschek |
| 4,982,608 A * | 1/1991 | Marki et al. ................... 73/756 |
| 6,105,434 A | 8/2000 | Engeler |
| 6,127,770 A * | 10/2000 | Hauser et al. ............... 310/338 |

FOREIGN PATENT DOCUMENTS

| AT | 215704 | 6/1961 |
| AT | 247028 | 5/1966 |
| AT | 384676 | 12/1987 |
| AT | 002036 | 2/1998 |

* cited by examiner

*Primary Examiner*—Walter Benson
*Assistant Examiner*—Derek J Rosenau
(74) *Attorney, Agent, or Firm*—Dykema Gossett PLLC

(57) ABSTRACT

A piezoelectric pressure sensor includes—an outer housing separated by an annular gap from an inner housing, which inner housing is attached to the outer housing on the pressure side. At least one piezoelectric measuring element is positioned between a diaphragm placed on the pressure side of the inner housing and a base part of the inner housing. The inner housing is provided with a massive cylindrical wall throughout whose wall thickness essentially corresponds to the thickness of the adjacent outer housing. In the annular gap between the outer housing and the inner housing a heat-transfer liquid is contained, or in the space between the base part of the inner housing and an interior shoulder of the pressure sensor a heat-transfer spring or bellows is located.

8 Claims, 3 Drawing Sheets

PIEZOELECTRIC PRESSURE SENSOR

BACKGROUND OF THE INVENTION

The invention relates to a piezoelectric pressure sensor with an outer housing and an inner housing separated by an annular gap from the outer housing, the inner housing being attached to the outer housing on the pressure side, where at least one piezoelectric measuring element is positioned between a diaphragm placed on the pressure side of the inner housing and a base part of the inner housing.

Piezoelectric pressure sensors for use under rough ambient conditions (high or fast-changing temperatures, vibrations, structure-borne sound) require a special design in order to deliver a clear, highly precise signal with a minimum noise level. The rough ambient conditions referred to are present for instance if the sensor is used in the combustion chamber of an internal combustion engine or in a testing station, where heavy mechanical loads caused by vibrations and structure-borne sound and extreme thermal loads due to the combustion process are to be coped with.

DESCRIPTION OF PRIOR ART

Prior art piezoelectric pressure sensors may be designed as shown in the sectional view of FIG. 1, for instance. In an outer housing 1 of the sensor several piezoelectric measuring elements 4 are placed between the electrodes 2 and 3, the measuring elements being preloaded by the membrane or diaphragm 5 which is welded to the housing 1 on the pressure side. One of the electrodes 2 is grounded, the other electrode 3 is insulated against the housing and connected to a socket 6 for the signal lead. The pressure sensor is provided with a screw thread 7 on the outer housing 1 for screwing it into a measuring bore, giving rise in the area 8 to disadvantageous influences due to structure-borne noise and deformations of the adjacent part (not shown in the drawing).

From AT 247 028 B there is known a piezoelectric pressure sensor, in particular for measuring the pressure curve in the cylinders of internal combustion engines, where a preloading sleeve is clamped in the interior of a cylindrical outer housing, which sleeve encloses the piezoelectric elements and is closed by a stamp transmitting the pressure to be measured. Between the preloading sleeve and the outer housing an annular gap is provided, which is covered by an annular diaphragm on the side of the combustion chamber. The diaphragm thus bridges the gap between inner and outer housing, into which a coolant may be fed via channels provided in the outer housing. To improve coolant circulation a sleeve may be provided in the annular gap. Disadvantages of this design, which are described in more detail further below, are due to the inner housing being configured as a preloading sleeve.

Similar disadvantages arise in AT 384 676 B, where there is disclosed a measurement pick-up element for measuring hot media and a method for mounting a measurement pick-up element used as a pressure pick-up. Here, too, a relatively massive outer housing contains a thin-walled preloading sleeve, which in turn houses the measuring elements. The diaphragm of the measurement pick-up element bridges an annular gap between outer housing and preloading sleeve and is welded to the outer housing. Both documents, i.e., AT 384 676 B and AT 247 028 B, show pressure pick-ups with a one-part housing and a tubular spring as preloading element for the measuring elements, which are strongly influenced by deformations of the housing.

In this context a pressure sensor has become known from EP 0 902 267 A2, which is suitable for measuring dynamic processes in gaseous or liquid media, e.g., in engines or turbosystems. The pressure sensor is provided with passive acceleration compensation, which consists essentially of an inner housing with a relatively thin cylindrical wall configured as a tubular spring and a massive base serving as the compensation mass. The inner part of the housing has a flange on the pressure side, onto which is welded the sensor diaphragm on one side and which, also on the pressure side, is joined by a welded connection to the outer housing. The piezoelectric measuring elements, which are preloaded in the inner housing part between the diaphragm and the compensation mass, are thus protected by an annular gap between inner and outer housing against direct transmission of structure-borne noise and deformation forces from the adjacent part into which the pressure sensor is screwed. Unfortunately, a sensor of this type is prone to overheating, i.e., the stack of measuring elements quickly overheats, since the heat transmitted to the piezoelectric measuring elements via diaphragm and pressure stamp cannot be carried off. A further disadvantage is to be seen in the fact that the inner housing part has a very thin cylindrical wall which is configured as a tubular spring. This makes the sensor sensitive to acceleration components in radial direction, all the more so as the base of the inner housing part carries a relatively large compensation mass.

SUMMARY OF THE INVENTION

It is an object of the present invention to improve a piezoelectric pressure sensor with or without acceleration compensation in such a way that on the one hand the measuring elements are shielded against negative influences due to structure-borne noise and deformation, and that on the other hand overheating of the sensor is avoided.

The invention achieves its objective by providing that the inner housing part is provided with a massive cylindrical wall throughout, whose wall thickness corresponds essentially to that of the adjacent outer housing, and that in the annular gap between outer housing and inner housing part or between the base of the inner housing and an interior shoulder of the pressure sensor there are provided means for transferring heat to the outer housing. To transfer heat from the inner housing part to the cooler outer housing and finally to the wall of the measuring bore, the invention provides a thermally conductive connection, which however does not—or only to a negligible extent—act as a mechanical coupling.

This will be achieved by filling the annular gap between outer housing and inner housing part with a heat-conductive fluid, for instance gallium, sodium, highly temperature-resistant oils, etc., or by alternatively or additionally placing in the annular gap a stamped metal foil, for instance of a wave-like structure, which is in thermal contact with the inner housing part as well as with the outer housing.

According to a variant of the invention there may be provided between the base of the inner housing and an interior shoulder of the pressure sensor a heat-transferring element, which is soft in axial direction as regards force transmission, for instance a tubular spring or bellows.

In an advantageous variant of the invention it is provided that the pressure sensor is furnished with a device for active axial acceleration compensation essentially consisting of a seismic mass, which is preloaded against piezoelectric compensating elements by a tensioning element.

It is especially provided that the device for active acceleration compensation is preloaded against the base of the inner housing on the side opposite of the at least one piezoelectric measuring element. By completely separating the functions of acceleration compensation and pressure measurement both functions may be optimized independently of each other.

BRIEF DESCRIPTION OF THE DRAWINGS

The invention will be further described below, with reference to the enclosed drawings. There is shown in.

The state-of-the-art piezoelectric pressure sensor has already been described in detail in the introduction.

DETAILED DESCRIPTION OF THE PREFERRED EMBODIMENTS

Figure 1:
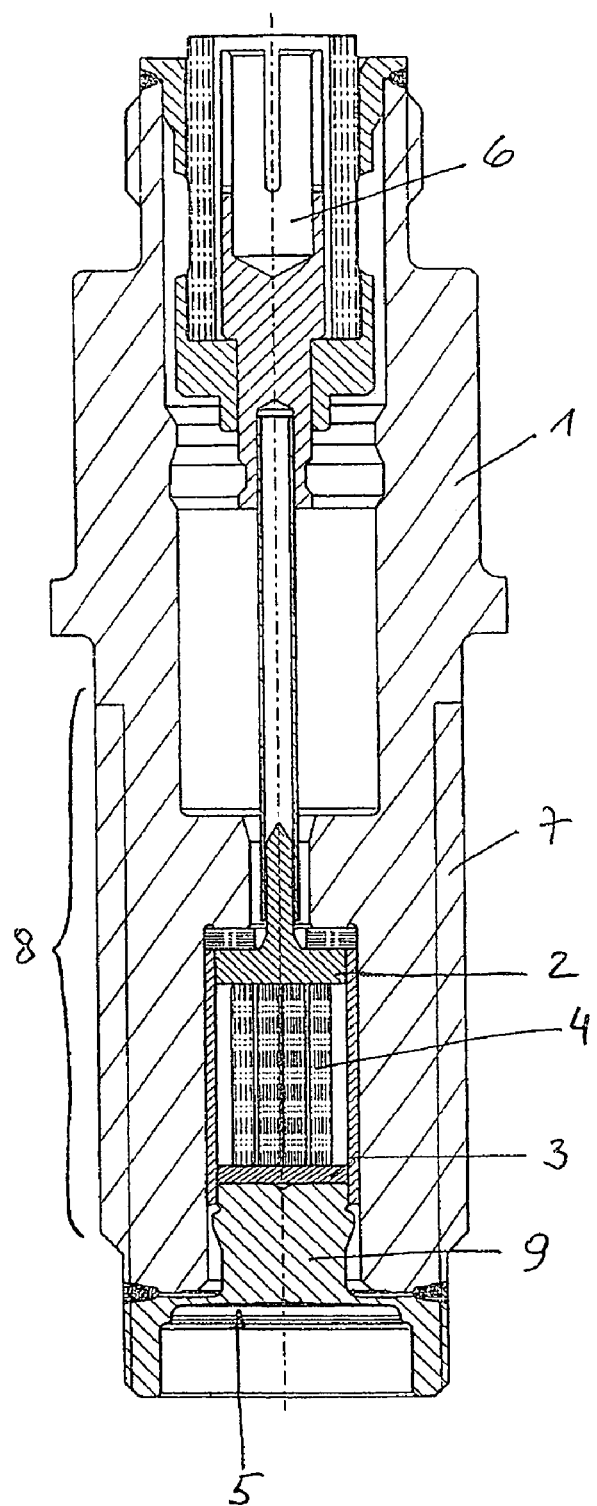
FIG. 1 a state-of-the-art piezoelectric pressure sensor in longitudinal section.
Figure 2:
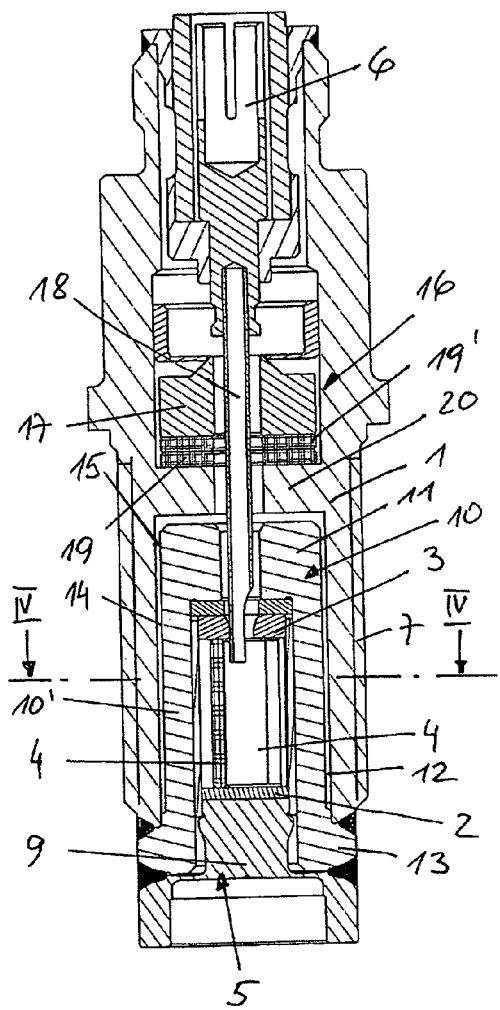
FIG. 2 a piezoelectric pressure sensor according to the invention including acceleration compensation in a sectional view as in FIG. 1.

The pressure sensor according to the invention as shown in FIG. 2 has an outer housing 1 containing an inner housing 10 separated from the outer housing by an annular gap 12, with at least one piezoelectric measuring element 4 being preloaded against the base of the inner housing, between the diaphragm 5 placed on the pressure side of the inner housing 10 and the base 11 of the inner housing 10. To improve the transfer of heat flowing in via the diaphragm 5 and the pressure stamp 9 from the inner housing 10 to the outer housing 1, the annular gap 12 between the inner housing 10 and the outer housing 1 is filled with a fluid 14 with good heat-conducting properties. Suitable materials are sodium, gallium or highly heat-resistant oils.

To provide a closed interior space for the heat-conducting fluid 14, the annular gap 12 is sealed on the side opposite the diaphragm 5 by a sealing element, for instance a membrane or foil 15. Over the entire critical area of the screw thread 7 there is thus established direct thermal contact between the inner housing 10 and the outer housing 1, while any mechanical coupling in this area is avoided. The inner housing 10 is attached to the outer housing 1 outside of the critical area by the flange 13 at the end of massive cylinder wall 10' of the inner housing 10.

The sensor according to FIG. 2 is furthermore provided with a device 16 for active axial acceleration compensation, consisting essentially of a seismic mass 17, which is preloaded against two piezoelectric compensation elements 19, 19' by means of a tensioning element 18 (e.g., a tubular spring). The compensation elements 19, 19' are supported by an interior shoulder 20 of the pressure sensor.

Figure 3:
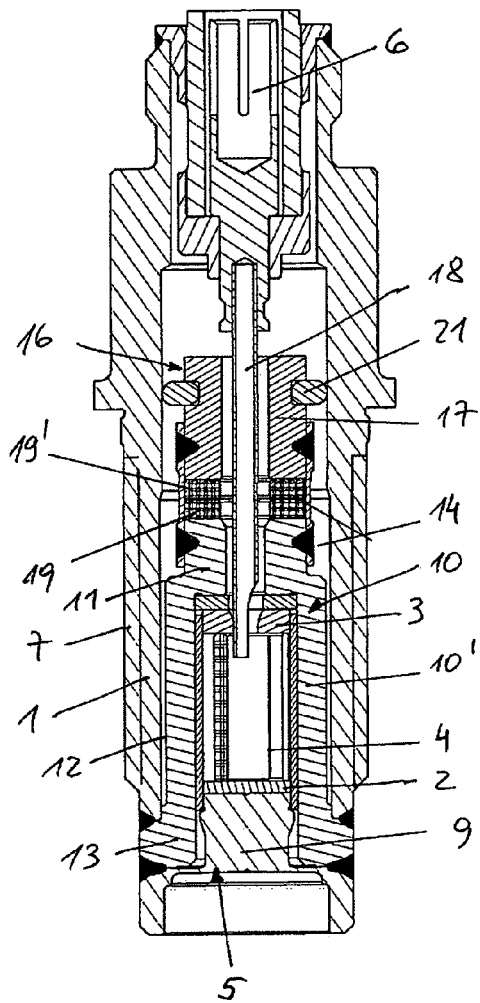
FIG. 3 a variant of the pressure sensor according to the invention—also with acceleration compensation—in a sectional view as in FIG. 1.

The variant of a pressure sensor according to the invention shown in FIG. 3 is primarily characterized by the feature that the device 16 for active acceleration compensation is preloaded directly against the base of the inner housing 10 on the side opposite the piezoelectric measuring element 4. The annular gap 12 containing the heat-conducting fluid 14 extends along the device for acceleration compensation in this variant and is sealed in this area against the remaining interior space of the sensor by means of a sealing ring 21.

Figure 4:
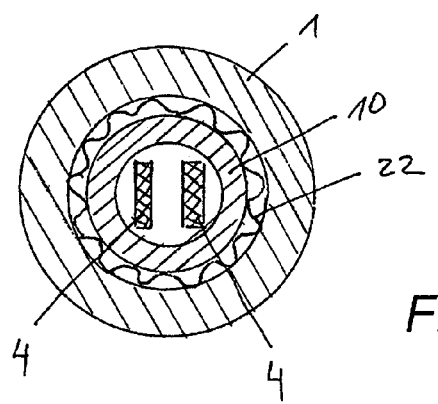
FIG. 4 a variant of the embodiment shown in FIG. 2 in a section along line IV-IV of FIG. 2; and in FIG. 5 a partially cut piezoelectric pressure sensor according to the invention without acceleration compensation.

As shown in FIG. 4 a stamped metal foil 22 (which in the example shown has a wave-shaped structure) may be placed in the annular gap 12 between outer 1 and inner housing 10 as a heat transfer medium, which metal foil 22 is in thermal contact with the inner 10 and the outer housing 1 by touching the facing side walls.

Figure 5:
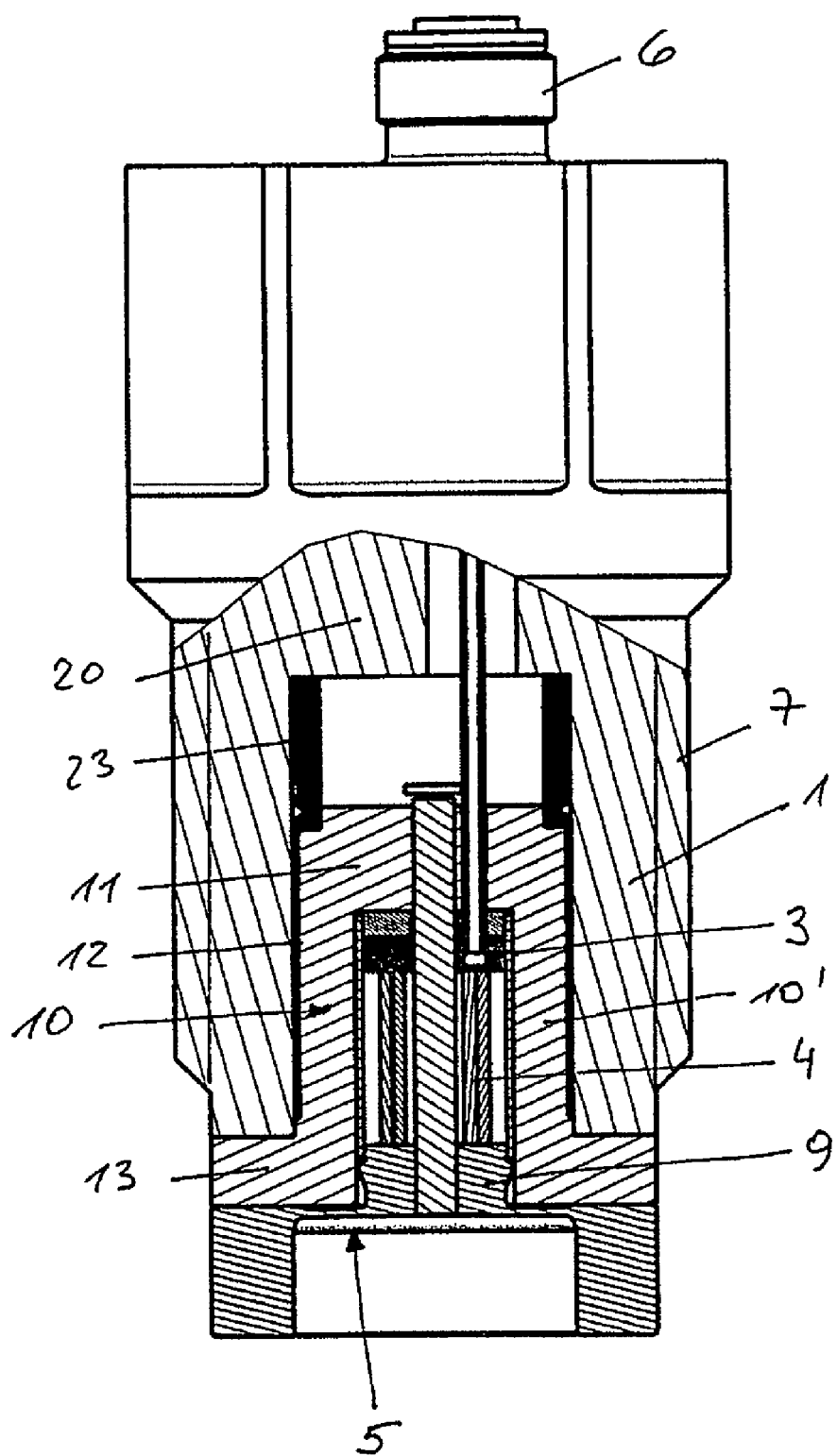

Finally, FIG. 5 shows a pressure sensor according to the invention without acceleration compensation. The inner housing 10, or rather its base 11, is at a greater distance from the interior shoulder 20 of the pressure sensor, thereby permitting a heat transfer element 23 to be placed between the base 11 and the shoulder 20, which provides weak force transmission in an axial direction. The heat transfer element 23 is for instance a tubular spring or bellows and is made of a metal with good heat conductive properties, thus enabling the heat in the inner housing 10 to be carried off in axial direction to the outer housing 1.

What is claimed is:

1. A piezoelectric pressure sensor comprising:
   an outer housing having a pressure side and an opposite interior shoulder,
   an inner housing having a pressure side and an opposite base part, the inner housing being attached to the outer housing on the pressure side of said outer housing and separated by annular gap from the outer housing, the inner housing having a cylindrical wall throughout whose wall thickness essentially corresponds to a thickness of the outer housing adjacent thereto,
   at least one piezoelectric measuring element positioned between a diaphragm placed on the pressure side of the inner housing and the base part of said inner housing, and
   a tubular spring or bellows extending between the base part of the inner housing and the interior shoulder of the outer housing for transferring heat to the outer housing, said tubular spring or bellows providing weak force transmission in an axial direction.

2. The piezoelectric pressure sensor according to claim 1, including a heat-conductive fluid in the annular gap between said outer housing and said inner housing.

3. The piezoelectric pressure sensor according to claim 2, wherein a sealing element is positioned in the annular gap on a side opposite the diaphragm.

4. The piezoelectric pressure sensor according to claim 3, wherein the sealing element is a sealing ring, a membrane or a foil.

5. The piezoelectric pressure sensor according to claim 1, including a stamped metal foil having a wave-shaped structure in the annular gap between said outer housing and said inner housing, said foil being in thermal contact with the inner housing as well as with the outer housing.

6. The piezoelectric pressure sensor according to claim 1, including a device for active axial acceleration compensation, comprising a seismic mass preloaded against at least one piezoelectric compensation element by a tensioning element.

7. The piezoelectric pressure sensor according to claim 6, wherein the device for active acceleration compensation is preloaded against the base part of the inner housing on a side opposite of the piezoelectric measuring element.

8. The piezoelectric pressure sensor according to claim 2, wherein the heat-conductive fluid is gallium, sodium or a highly temperature resistant oil.

* * * * *